United States Patent
Mimuro et al.

(10) Patent No.: US 7,675,327 B2
(45) Date of Patent: Mar. 9, 2010

(54) SEMICONDUCTOR DEVICE

(75) Inventors: Ken Mimuro, Toyama (JP); Mikiya Uchida, Kyoto (JP)

(73) Assignee: Panasonic Corporation, Osaka (JP)

( * ) Notice: Subject to any disclaimer, the term of this patent is extended or adjusted under 35 U.S.C. 154(b) by 9 days.

(21) Appl. No.: 11/433,622

(22) Filed: May 12, 2006

(65) Prior Publication Data

US 2007/0040583 A1 Feb. 22, 2007

(30) Foreign Application Priority Data

Aug. 16, 2005 (JP) .............................. 2005-235972

(51) Int. Cl.
*H03K 19/094* (2006.01)
(52) U.S. Cl. ......................................... 326/88
(58) Field of Classification Search ................... 326/88
See application file for complete search history.

(56) References Cited

U.S. PATENT DOCUMENTS

| | | | |
|---|---|---|---|
| 3,872,321 A * | 3/1975 | Matsue | 326/119 |
| 3,986,044 A | 10/1976 | Madland et al. | |
| 4,490,628 A | 12/1984 | Ogura | |
| 5,680,071 A * | 10/1997 | Senoh et al. | 327/390 |
| 6,077,736 A | 6/2000 | Hwang et al. | |
| 6,271,685 B1 | 8/2001 | Nagasawa et al. | |
| 6,770,941 B2 * | 8/2004 | Shinozaki et al. | 257/369 |
| 2001/0050546 A1 * | 12/2001 | Marty | 323/280 |
| 2004/0227833 A1 | 11/2004 | Murakami et al. | |
| 2005/0099068 A1 | 5/2005 | Kimura | |
| 2005/0218460 A1 * | 10/2005 | Hasegawa et al. | 257/390 |
| 2005/0264343 A1 * | 12/2005 | Nakamura | 327/536 |
| 2006/0007336 A1 | 1/2006 | Yamaguchi | |

FOREIGN PATENT DOCUMENTS

| | | |
|---|---|---|
| DE | 31 42 557 A1 | 8/1982 |
| EP | 0 926 828 A1 | 6/1999 |
| EP | 1 387 491 A2 | 2/2004 |
| EP | 1 542 285 A1 | 6/2005 |
| JP | 53-125753 A | 11/1978 |
| JP | 63-139426 A | 6/1988 |
| JP | 10-012742 A | 1/1998 |
| JP | 2004-312311 | 11/2004 |

* cited by examiner

*Primary Examiner*—Rexford N Barnie
*Assistant Examiner*—Thienvu V Tran
(74) *Attorney, Agent, or Firm*—Hamre, Schumann, Mueller & Larson, P.C.

(57) ABSTRACT

The semiconductor device of the present invention includes a bootstrap circuit, the bootstrap circuit including: a selection transistor composed of an n-channel MOS transistor; a booster transistor of which a gate is connected to a drain of the selection transistor; and a boosting circuit that is connected between the gate and a source of the booster transistor, and boosts gate voltage with respect to the source of the booster transistor, wherein gate dimensions of the selection transistor are smaller than gate dimensions of the booster transistor. According to this configuration, the semiconductor device can realize increasing an action of a circuit, decreasing a chip size and simplifying processes.

6 Claims, 6 Drawing Sheets

FIG. 5A Register input

FIG. 5B Clock

FIG. 5C Selection transistor output

FIG. 5D Output control signal

FIG. 5E Output signal

SEMICONDUCTOR DEVICE

BACKGROUND OF THE INVENTION

1. Field of the Invention

The present invention relates to a semiconductor device that can be used effectively in a solid-state imaging device including: a photosensitive region in which a plurality of photosensitive cells are disposed in a matrix; a driving circuit for driving the plurality of photosensitive cells that is constituted by a dynamic circuit; a scanning circuit for selecting the plurality of photosensitive cells; and a bootstrap circuit for transmitting a selection signal from the scanning circuit to a driving circuit. In particular, the present invention relates to the bootstrap circuit.

2. Description of Related Art

In recent years, attention has been directed to a solid-state imaging apparatus provided with an amplification-type MOS sensor, as one of solid-state imaging apparatuses. In this solid-state imaging apparatus, a signal detected by a photodiode is amplified by a transistor for each cell (pixel), and the apparatus has a feature of high sensitivity. Such a solid-state imaging apparatus is provided with: an imaging portion having a multiplicity of pixels arranged two-dimensionally; and a dynamic-type shift register that scans horizontally or vertically, thus simplifying a circuit, increasing a density thereof and reducing power consumption.

Patent document 1 (JP 2004-312311 A) discloses an example of a solid-state imaging apparatus. The solid-state imaging apparatus disclosed in Patent document 1 includes: an imaging portion having a plurality of pixels; and a scanning circuit constituted by a dynamic logic circuit that outputs a selection signal for selecting a pixel in the imaging portion. This apparatus includes a bootstrap circuit between the scanning circuit and the imaging portion. The bootstrap circuit holds the selection signal from the scanning circuit in one horizontal scanning cycle, and then outputs, to the imaging portion, an AND result obtained by the thus held selection signal and a driving signal that designates an output signal to the imaging portion. The bootstrap circuit can select a desired pixel in the imaging portion, and can output an image signal based on the selected pixel.

FIG. 3 is a circuit diagram showing the configuration of a typical solid-state imaging apparatus. As shown in FIG. 3, several hundreds of thousands to several million photosensitive cells are disposed in matrix, each photosensitive cell including: a photodiode 11; a readout gate 12; an amplifier transistor 14; and a reset transistor 13. Thereby, a video signal with a high resolution can be obtained.

Each of the drains of the amplifier transistor 14 and the reset transistor 13 is connected to a common drain line 16. A source of the amplifier transistor 14 is connected to a vertical signal line 10. A load transistor 15 is connected to one end of the vertical signal line 10, and a noise removal circuit 18 is connected to the other end of the vertical signal line 10. An output line of the noise removal circuit 18 is connected to a horizontal transistor 20 that is driven by a horizontal driving circuit 19.

A vertical driving circuit 17 controls normal scanning and scanning for an electronic shutter with respect to a group of photosensitive cells, based on an output signal Reg-in from a scanning circuit (not shown in the figure) constituted by registers. Specifically, the vertical driving circuit 17 controls them so as to select a predetermined photosensitive cell at the time of scanning.

The horizontal driving circuit 19 controls the normal scanning and the scanning for the electronic shutter with respect to the group of photosensitive cells, based on the output signal Reg-in from the scanning circuit (not shown in the figure) constituted by the registers. Specifically, the horizontal driving circuit 19 controls them so as to select a predetermined row of photosensitive cells at the time of the scanning.

The bootstrap circuit is included in each of the horizontal driving circuit 19 and the vertical driving circuit 17, and is necessary for the horizontal transistor 20 and a read out pixel to achieve selecting actions efficiently. A configuration of the bootstrap circuit will be described below in detail.

The noise removal circuit 18 is disposed between the group of photosensitive cells and the horizontal transistor 20, and removes a noise component contained in a pixel signal that is output from the photosensitive cell.

The number of the disposed horizontal transistors 20 is equal to the number of the rows of the photosensitive cells, and each horizontal transistor 20 acts for selecting a predetermined row of pixels at the time of pixel selection. By switching on the horizontal transistor 20 that corresponds to the predetermined row of pixels based on a selection signal from the horizontal driving circuit 19, the predetermined row of pixels can be selected, and the pixel signal that is output from the photosensitive cell can be output from an output terminal 9.

FIG. 4 is a circuit diagram of the bootstrap circuit, and the bootstrap circuit includes: a selection transistor 21; a booster transistor 22; and a boosting capacitor 23. The boosting capacitor 23 is provided between a gate and a source of the booster transistor 22, and boosts a gate voltage by utilizing a voltage stored in the capacitor, thereby increasing a transmission efficiency between the drain and the source.

The actions will be described below.

For obtaining a pixel signal, by selecting the predetermined photosensitive cell from the group of photosensitive cells that are disposed in a matrix as shown in FIG. 3, the horizontal driving circuit 19 selects the predetermined row of photosensitive cells. Specifically, the selection transistor 21 in the bootstrap circuit that corresponds to the predetermined row of photosensitive cells, among the bootstrap circuits in the horizontal driving circuit 19, is switched on, based on the control signal Reg-in and a clock CLK from the scanning circuit (not shown in the figure).

Next, a voltage boosted by: an output control signal (hereinafter, called a Trans signal) to be input into the horizontal driving circuit 19; and the boosting capacitor 23 is input into the booster transistor 22. The booster transistor 22 outputs a difference between the input voltage and a threshold value (the selection signal for selecting the row of photosensitive cells). The horizontal selection transistor 20 acts based on the difference value that is output from the booster transistor 22, thereby selecting the predetermined row of photosensitive cells.

Moreover, the vertical driving circuit 17 selects the predetermined photosensitive cell from the row of photosensitive cells selected by the horizontal driving circuit 19. More specifically, the vertical driving circuit 17 outputs the selection signal from the bootstrap circuit that corresponds to the predetermined photosensitive cell to the photosensitive cell. Thereby, the predetermined photosensitive cell is selected. In addition, since an action of the bootstrap circuit in the vertical driving circuit 17 is the same as the above-described action of the bootstrap circuit in the horizontal driving circuit 19, explanations thereof will be omitted.

As mentioned above, the predetermined photosensitive cell (pixel) can be selected by the horizontal driving circuit 19 and the vertical driving circuit 17.

Next, the pixel signal that is photosensitized by the photodiode 11 in the selected photosensitive cell is amplified by the amplifier transistor 14, and is input into the noise removal circuit 18 via the vertical signal line 10. The noise removal circuit 18 removes a noise component of the input pixel signal, and outputs it from the output terminal 9 to the outside via the horizontal transistor 20.

Next, an action of the bootstrap circuit will be described in detail.

FIG. 5 is a timing chart showing the action of the bootstrap circuit. Firstly, when an input signal 31 (FIG. 5A) is input from a register (not shown in the figure) into a source of the selection transistor 21 at a timing t1, a gate of the selection transistor 21 is switched on based on a clock signal 32 (FIG. 5B), and the drain outputs an output signal 33 (FIG. 5C). The output signal 33 is input into a gate of the booster transistor 22, and since a voltage of the output signal 33 at this time is a threshold value of the booster transistor 22 or lower, the booster transistor 22 is in a state of off. Thereafter, the selection transistor 21 is in a state of off in one horizontal scanning cycle.

Next, at a timing t2, the Trans signal 34 (FIG. 5D) is input into the boosting capacitor 23 and the source of the booster transistor 22. When the Trans signal 34 is input, the voltage is boosted by the boosting capacitor 23, and the output signal 35 with the boosted voltage is input into the gate of the booster transistor 22. Thereby, the booster transistor 22 is switched on, and the drain outputs a selection signal 36 (FIG. 5E).

FIG. 6 is a cross-sectional view showing a configuration of transistor elements used in a conventional bootstrap circuit. In the figure, a selection transistor 49 corresponds to the selection transistor 21 of FIG. 4, and a booster transistor 50 corresponds to the booster transistor 22 of FIG. 4. A peripheral logic transistor 40 is mounted with the bootstrap circuit on the same substrate, but is used for circuits other than the bootstrap circuit.

In addition, the semiconductor device shown in this cross-sectional view is an MOS type solid-state imaging apparatus manufactured by utilizing a miniaturized CMOS logic technology with a size of 0.25 μm or less, in which STI (Shallow Trench Isolation) is used for element isolation and a gate oxide film is formed to have a thickness of 10 nm or less. A lamination structure includes: a p-well 42; an element isolation region 43 (hereinafter, called STI); a gate oxide film 44; a gate electrode 45; a side wall 46; a source/drain region 47; and an LDD (Lightly Doped Drain) region 48 that are formed in this order in a p-type silicone substrate 41. The selection transistor 49, the booster transistor 50 and the peripheral logic transistor 40 respectively are formed on the same substrate.

In FIG. 6, L4 and L7 respectively denote a gate length and a gate film thickness of the selection transistor 49, L5 denotes a gate length of the booster transistor 50, and L6 and L8 respectively denote a gate length and a gate film thickness of the peripheral logic transistor 40. Herein, a gate film thickness of the booster transistor 50 is equal to L7.

Since the selection transistor 49 and the booster transistor 50 constituting the bootstrap circuit are driven by the application of the high voltage boosted by the boosting capacitor 23 as mentioned above, L4 and L7 respectively are made to be larger than L6 and L8 of the peripheral logic transistor 40 so that the selection transistor 49 and the booster transistor 50 can resist the high voltage. As mentioned above, the bootstrap circuit is required to have a configuration that is capable of resisting the high voltage that is boosted in the circuit.

In addition, the transistor constituting the bootstrap circuit is required to ensure a drain withstand voltage, a sustain withstand voltage and the like against the input high voltage. The drain withstand voltage represents a drain voltage at the time when a predetermined amount of a current or more flows between the drain and the well, while increasing the drain voltage gradually in a state that each of a gate voltage, a source voltage and a well voltage is 0 V. The sustain withstand voltage represents a withstand voltage in the drain when the gate voltage is not 0 V, and accordingly, represents the gate voltage dependence of the drain withstand voltage.

In order to decrease the size of a solid-state imaging device more, the size of a transistor that is an element of the solid-state imaging device is required to be decreased more. However, there is a problem that the gate dimensions of the transistor used in the bootstrap circuit cannot be decreased so that the transistor may ensure its withstand voltage against the high voltage input thereto, and thus a size of the transistor cannot be decreased. That is, the configuration that can resist a high voltage in the transistor requires the large gate dimensions (the gate film thickness and the gate length).

In addition, although an increase of the number of pixels of the solid-state imaging device requires an increase of a speed of an action of the circuit, the gate dimensions (including the gate film thickness and the gate length) cannot be decreased in order to ensure the withstand voltage of the transistor, and thus there is a problem that it is difficult to increase the speed. That is, by increasing the gate dimensions (the gate film thickness and the gate length), a speed of response of the transistor decreases, which may prevent the increase of the speed of the solid-state imaging device.

Moreover, since the film thickness L7 and the film thickness L8 have different dimensions as shown in FIG. 6, in the case where the selection transistor 49, the booster transistor 50 and the peripheral logic transistor 40 are formed on the same substrate, additional processes such as mask alignment, washing, gate oxidation and resist removal are required for forming each of the gate oxide films having different film thicknesses, and thus there is a problem that the processes become complicated.

SUMMARY OF THE INVENTION

Therefore, with the foregoing in mind, it is an object of the present invention to provide a semiconductor device that allows increasing an action of a circuit, decreasing a chip size and simplifying processes in a bootstrap circuit.

In order to attain the above-mentioned object, the semiconductor device of the present invention is a semiconductor device including a bootstrap circuit, the bootstrap circuit including: a first transistor composed of an n-channel MOS transistor; a second transistor of which a gate is connected to a drain of the first transistor; and a boosting capacitor that is connected between the gate and a source of the second transistor, wherein a gate length of the first transistor is smaller than a gate length of the second transistor.

These and other advantages of the present invention will become apparent to those skilled in the art upon reading and understanding the following detailed description with reference to the accompanying figures.

DETAILED DESCRIPTION OF THE INVENTION

The semiconductor device of the present invention may have a configuration where a gate film thickness of the first transistor is equal to a gate film thickness of the second transistor.

In addition, the semiconductor device of the present invention may have a configuration where an impurity density in a channel of the first transistor is lower than an impurity density in a channel of the second transistor.

In addition, the semiconductor device of the present invention may have a configuration where the gate length of the second transistor ranges from 0.5 μm to 0.6 μm.

According to the present invention, by decreasing the size of the first transistor, a chip size of the semiconductor device can be decreased. In addition, a voltage of a threshold value of the first transistor can be decreased, and thus the speed of action of a circuit can be increased. Moreover, since all of the gate oxide films have the same film thickness, processes can be simplified.

Embodiment 1

Figure 1:
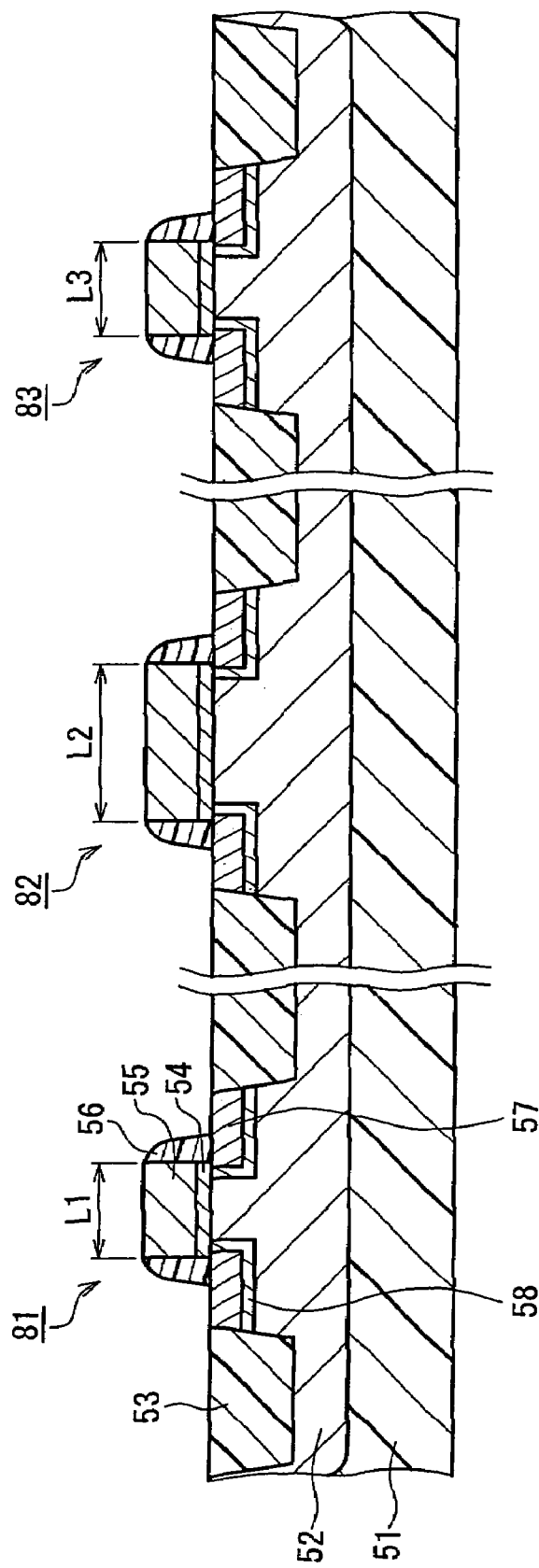
FIG. 1 is a cross-sectional view of a semiconductor device of Embodiment 1.

FIG. 1 is a cross-sectional view of a semiconductor device of Embodiment 1. In FIG. 1, only a selection transistor 81, a booster transistor 82 and a peripheral logic transistor 83 that are provided in the semiconductor device are described.

The semiconductor device of the present embodiment is used in an MOS type solid-state imaging apparatus that is manufactured by a miniaturized CMOS logic technology with a size of 0.25 μm or less, in which element isolation is performed by STI (Shallow Trench Isolation), and a gate oxide film is formed to have a film thickness of 10 nm or less.

As shown in FIG. 1, each of the selection transistor 81, the booster transistor 82 and the peripheral logic transistor 83 includes: a p-well 52; an element isolation region 53 (hereinafter, called STI) that electrically isolates each of the transistor elements; a gate oxide film 54 that is formed above the p-well 52; a gate electrode 55 that is formed above the gate oxide film 54; a side wall 56 that protects sides of the gate oxide film 54 and the gate electrode 55; a source/drain region 57 that is formed in the p-well 52; and an LDD region 58 that is formed around the source/drain region 57, which are structured in a p-type silicone substrate 51. In this manner, the respective transistors are formed on the same substrate.

Figure 4:
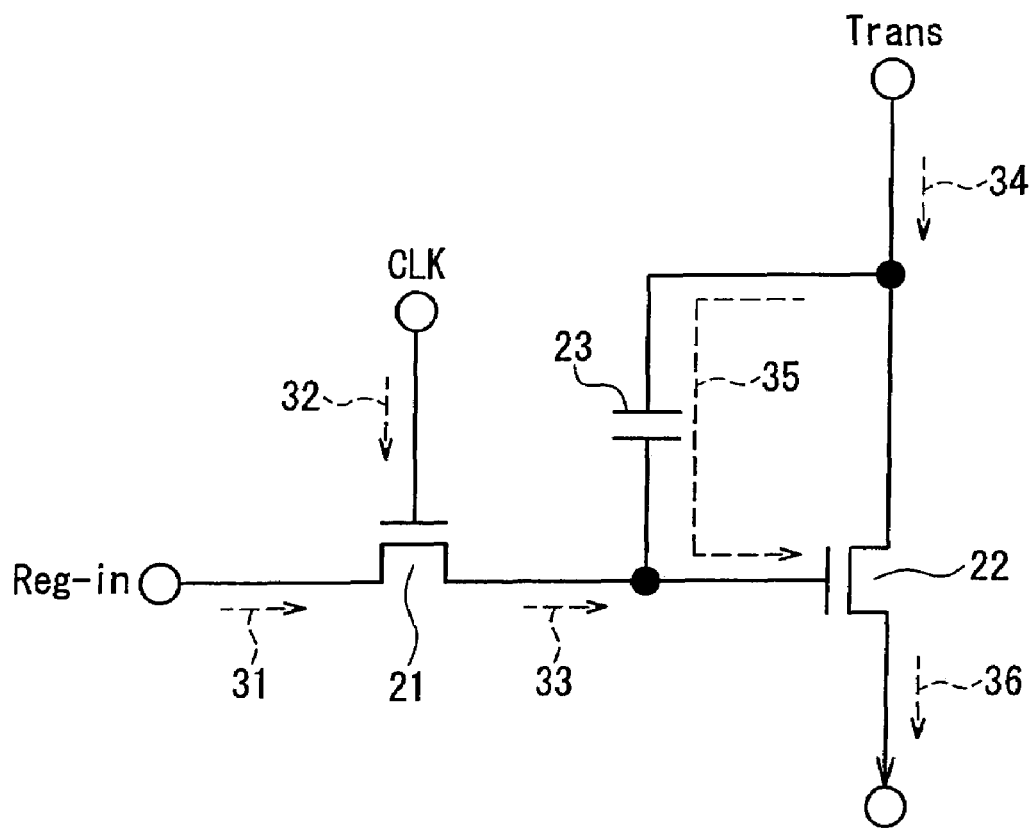
FIG. 4 is a circuit diagram of a bootstrap circuit in the solid-state imaging apparatus.
Figure 5:
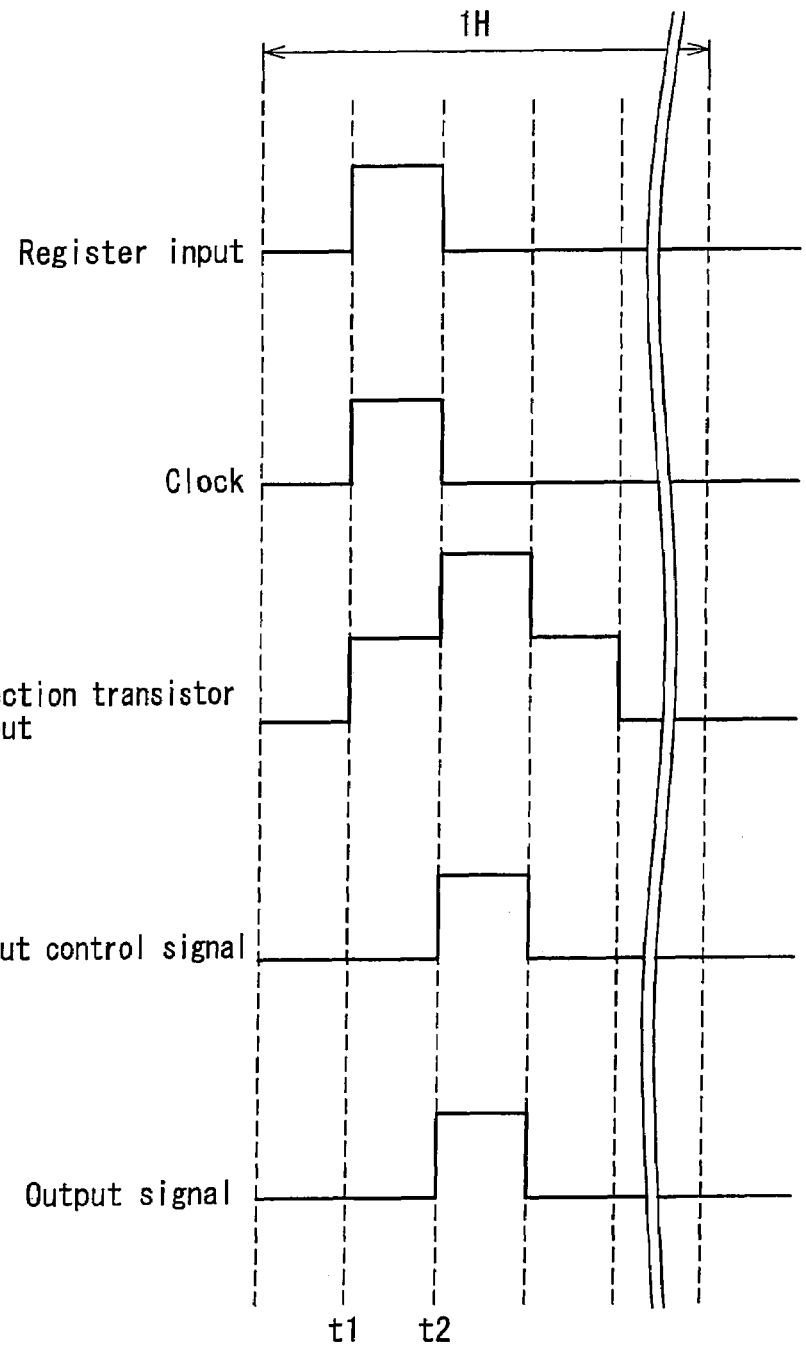
FIG. 5 is a timing chart showing an action of the bootstrap circuit.
Figure 6:
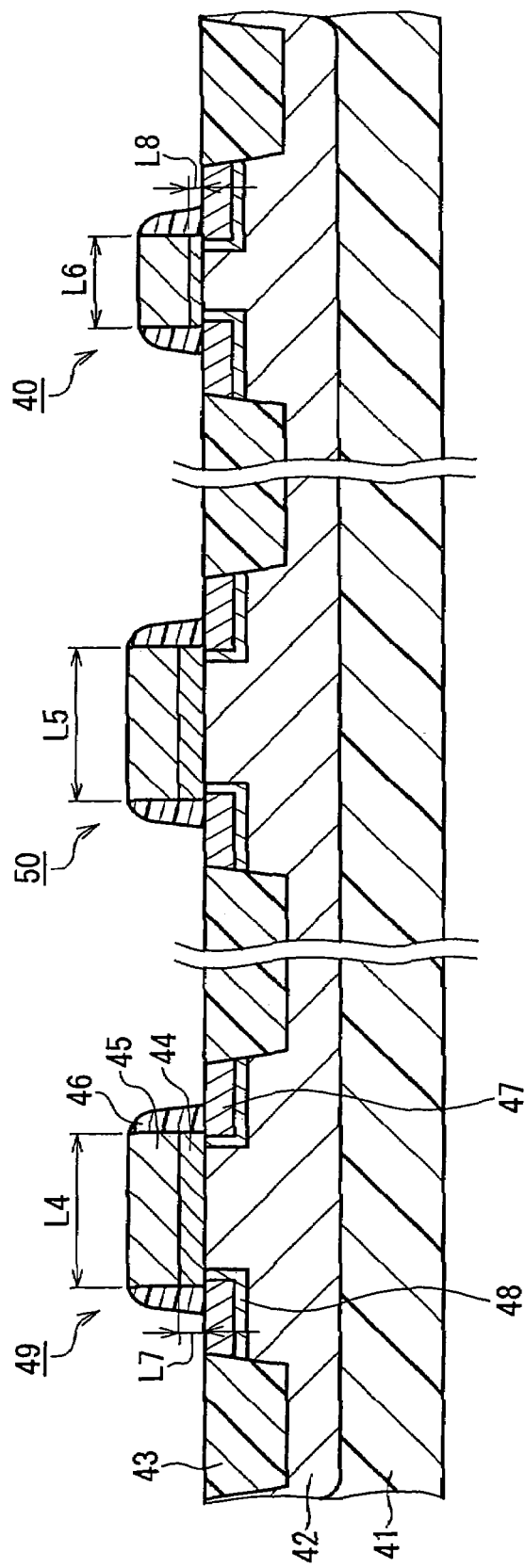
FIG. 6 is a cross-sectional view of a conventional semiconductor device.

The selection transistor 81 and the booster transistor 82 respectively correspond to the selection transistor 21 and the booster transistor 22 of FIG. 4, and act as shown in the timing chart of FIG. 5.

The selection transistor 21 outputs the output signal 33 at a timing t1 of FIG. 5, and subsequently is turned off. Then, since the signal 35 (that is, the gate voltage of the booster transistor 22) of which a voltage is boosted by the boosting capacitor 23 is input into a drain region of the selection transistor 21 at a timing t2 of FIG. 5, the selection transistor 21 is required to have a configuration with a high drain withstand voltage. However, since the selection transistor 21 is in a state of off at this time, a sustain withstand voltage of the selection transistor 21 is not required to be high.

Since the drain withstand voltage depends mainly on a diffusion withstand voltage (a withstand voltage of a diffusion layer at a pn junction between the source/drain and the p-well), and does not depend on the gate dimensions (the gate length and the gate film thickness). Thus, even when gate dimensions of the selection transistor 21 are smaller than gate dimensions of the booster transistor 22, the drain withstand voltage can be ensured. Moreover, even when the gate dimensions of the selection transistor 21 are equal to those of the peripheral logic transistor, the drain withstand voltage can be ensured.

In addition, the booster transistor 82 is required to have a gate length equivalent to a gate length of the conventional booster transistor so as to ensure a withstand voltage against a high voltage to be applied thereto.

The transistor in the bootstrap circuit of Embodiment 1 satisfies a relationship of $L3 \leq L1 < L2$, where L1 denotes the gate length of the selection transistor 81, L2 denotes the gate length of the booster transistor 82, and L3 denotes a minimum gate length of the peripheral logic transistor 83, as shown in FIG. 1.

In addition, in the present embodiment, the gate length L2 of the booster transistor 82 ranges from 0.5 μm to 1 μm, and preferably ranges from 0.5 μm to 0.6 μm, considering that the booster transistor 82 is manufactured by miniaturized processes. Moreover, each of the gate length L1 of the selection transistor 81 and the gate length L3 of the peripheral logic transistor 83 ranges from 0.25 μm to 0.5 μm, and preferably is 0.4 μm.

Next, the film thickness of the gate oxide film 54 will be described.

Firstly, with regard to the booster transistor 82, only a gate oxide film withstand voltage needs to be considered. Conventionally, a gate film thickness of a booster transistor is restricted by a sustain withstand voltage of a selection transistor, and thus cannot have a smaller film thickness. However, according to the present embodiment, since the selection transistor 81 is in a state of off when the voltage is boosted, the sustain withstand voltage of the selection transistor 81 is not required to be considered, and only the drain withstand voltage needs to be considered. As mentioned above, since the drain withstand voltage does not depend on the gate dimensions (the gate length and the gate film thickness), the gate film thickness of the selection transistor 21 can be decreased regardless of the drain voltage, and the gate film thickness of the booster transistor 82 also can be decreased. Furthermore, the gate film thicknesses of the selection transistor 81 and the booster transistor 82 also can be decreased to be equivalent to the gate film thickness of the peripheral logic transistor 83.

Therefore, in the manufacturing process of the solid-state imaging apparatus for disposing the selection transistor 81, the booster transistor 82 and the peripheral logic transistor 83 on the same substrate, gate oxide films having plural different film thicknesses are not required to be formed, and gate oxide films having only one film thickness are required to be formed. Thus, processes such as mask alignment, washing, gate oxidation and resist removal that conventionally are required for forming each of the gate oxide films having the different film thicknesses can be omitted, which can simplify the processes, thus leading to the cost reduction.

As mentioned above, according to the present embodiment, the gate dimensions of the selection transistor 81 can be decreased, thus decreasing the chip size and increasing the speed of the action of the circuit.

In addition, since the selection transistor 81, the booster transistor 82 and the peripheral logic transistor 83 can have the same gate film thickness, the manufacturing processes can be simplified.

Embodiment 2

Figure 2:
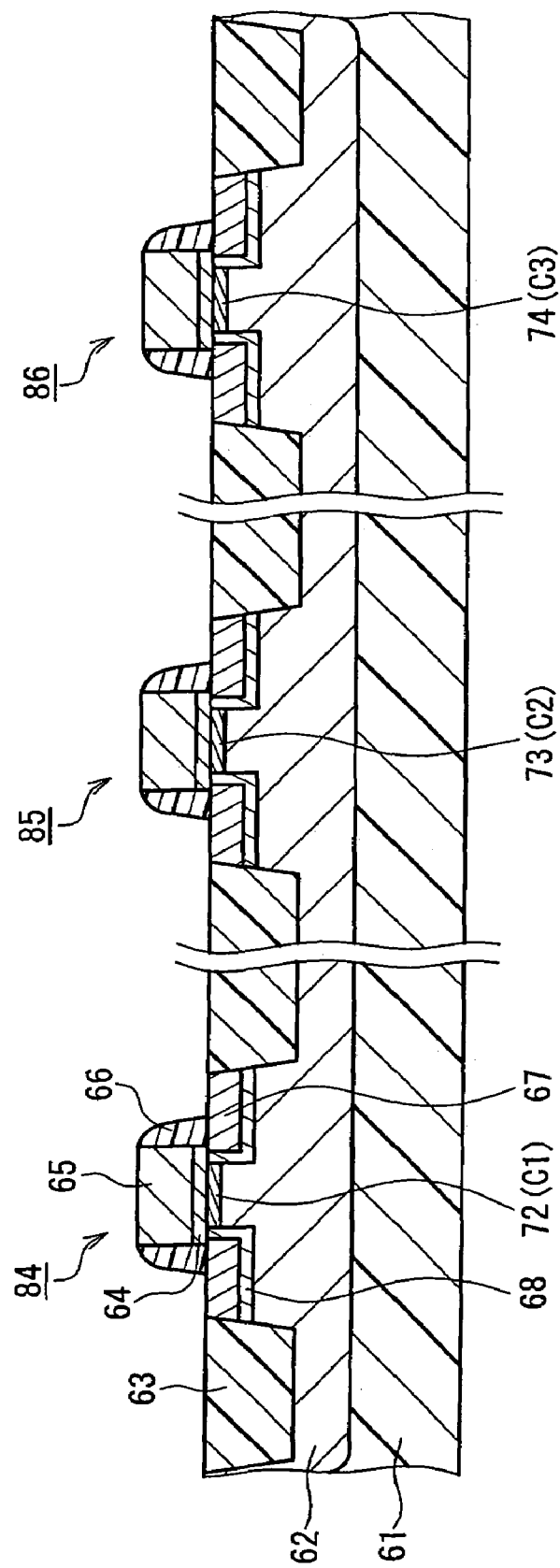
FIG. 2 is a cross-sectional view of a semiconductor device of Embodiment 2.
Figure 3:
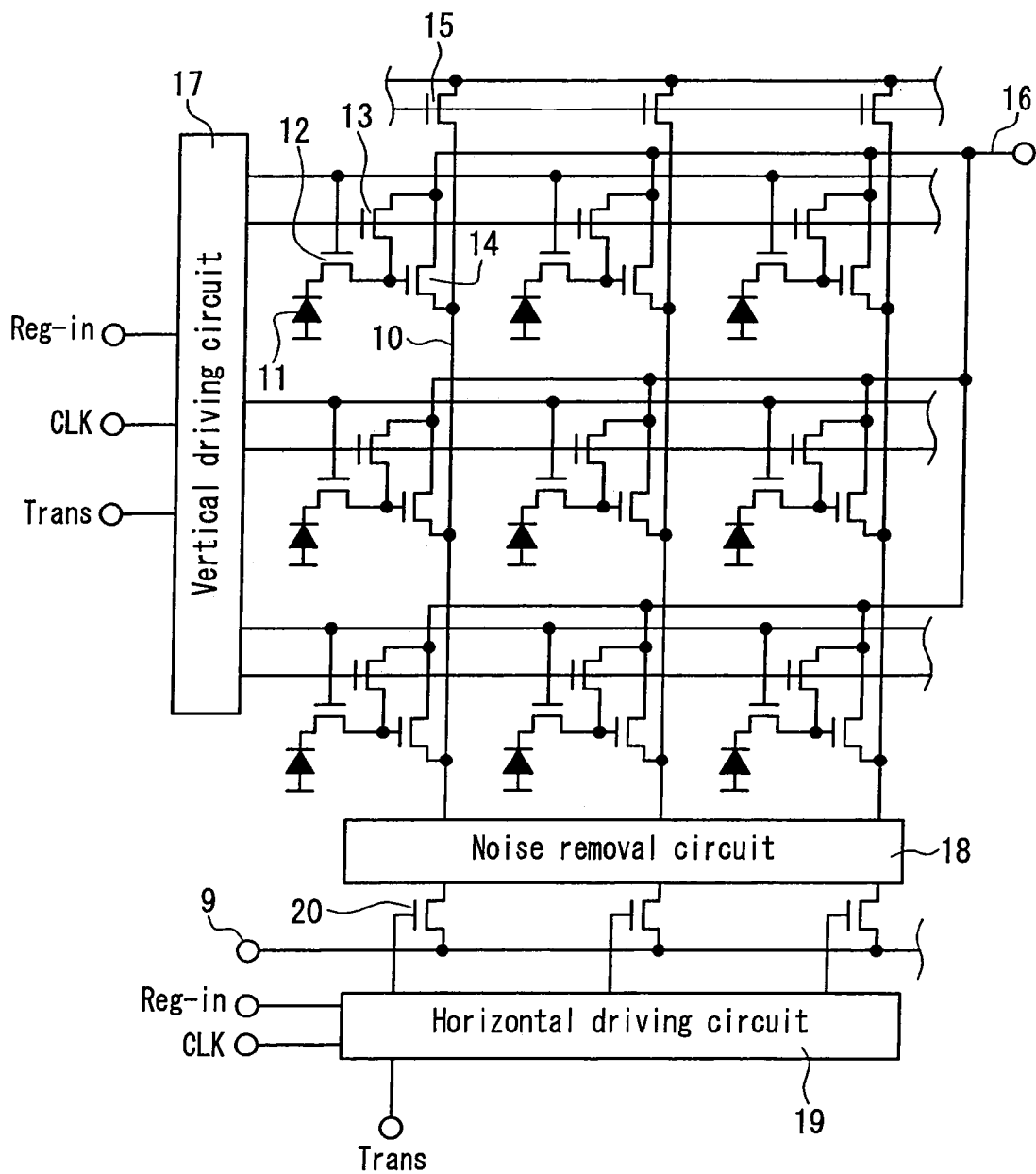
FIG. 3 is a circuit diagram of a solid-state imaging apparatus.

FIG. 2 is a cross-sectional view of a semiconductor device of Embodiment 2. In FIG. 2, only a selection transistor 84, a booster transistor 85 and a peripheral logic transistor 86 that are provided in the semiconductor device are described.

The semiconductor device of Embodiment 2 is an MOS type solid-state imaging apparatus that is manufactured by a miniaturized CMOS logic technology with a size of 0.25 μm or less, in which element isolation is performed by STI, and a gate oxide film is formed to have a film thickness of 10 nm or less.

As shown in FIG. 2, each of the selection transistor 84, the booster transistor 85 and the peripheral logic transistor 86 includes: a p-well 62; an element isolation region 63 (hereinafter, called STI) that electrically isolates each of the transistor elements; a gate oxide film 64 that is formed above the p-well 62; a gate electrode 65 that is formed above the gate oxide film 64; a side wall 66 that protects sides of the gate oxide film 64 and the gate electrode 65; a source/drain region 67 that is formed in the p-well 62; an LDD region 68 that is formed around the source/drain region 67; and channel regions 72 to 74 each provided in a part facing the gate oxide film 64 in the p-well 62, which are structured in a p-type silicone substrate 61. In this manner, the respective transistors are formed on the same substrate.

In the present embodiment, impurity densities of the respective channel regions are set so as to satisfy a relationship of C1<C2=C3 or C1=C3<C2, where C1 denotes a density of the channel region 72 of the selection transistor 84, C2 denotes a density of the channel region 73 of the booster transistor 85, and C3 denotes a density of the channel region 74 of the peripheral logic transistor 86.

Each of the densities C1 to C3 represents a density of an impurity layer for controlling a voltage of a threshold value (Vt), where the lower density provides the smaller Vt. More specifically, according to the above formula, the densities of the channel regions of the transistors respectively are set so that at least Vt of the selection transistor 84 may be smaller than Vt of the booster transistor 85 (that is, C1<C2).

Therefore, even when all of the selection transistor 84, the booster transistor 85 and the peripheral logic transistor 86 have the same gate dimensions, the voltages of the threshold values of the respective transistors can be different.

As mentioned above, according to the present embodiment, the speed of the action of the circuit can be increased without decreasing the gate dimensions of the selection transistor 84.

In addition, by setting the density C1 of the channel region impurity layer that is positioned below the gate electrode 65 of the selection transistor 84 to be smaller than C2 and C3, or to be equal to C3 and smaller than C2, a pn junction capacitance between the LDD region impurity layer 68 having a conductivity type opposite to a conductivity type of the p-well 62 and the channel region 72 can be increased.

The present invention can be applied effectively not only to a solid-state imaging apparatus using a bootstrap circuit, but also to any apparatus using a bootstrap circuit, which is not limited to a solid-state imaging apparatus.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising a bootstrap circuit, the bootstrap circuit comprising:
   a selection transistor that is an n-channel MOS transistor;
   a boosting transistor; and
   a boosting capacitor,
   wherein a drain of the selection transistor is connected to a gate of the boosting transistor and one terminal of the boosting capacitor, and another terminal of the boosting capacitor is connected to a source of the boosting transistor,
   a signal generated by boosting, with the boosting capacitor, voltages of input signals inputted to a source of the selection transistor and the source of the boosting transistor, is applied to the drain of the selection transistor and a gate of the boosting transistor when the selection transistor is in a state of off,
   a gate length of the selection transistor is set to be smaller than a gate length of the boosting transistor such that the selection transistor operates at a high speed, and
   a gate oxide film thickness of the selection transistor is equal to a gate oxide film thickness of the boosting transistor.

2. The semiconductor device according to claim 1, wherein an impurity density in a channel of the selection transistor is lower than an impurity density in a channel of the boosting transistor.

3. The semiconductor device according to claim 1, wherein the gate length of the boosting transistor ranges from 0.5 μm to 0.6 μm.

4. A solid-state imaging device comprising:
   a photosensitive cell group in which a plurality of photosensitive cells having photodiodes are disposed in a matrix; and
   a vertical driving circuit and a horizontal driving circuit that control the photosensitive cell group,
   wherein the vertical driving circuit and the horizontal driving circuit include the bootstrap circuit according to claim 1.

5. The semiconductor device according to claim 1 further comprising a peripheral logic transistor,
   wherein the gate length of the selection transistor is equal to or larger than a gate length of the peripheral logic transistor.

6. The solid-state imaging device according to claim 4, wherein the bootstrap circuit further comprises a peripheral logic transistor,
   wherein the gate length of the selection transistor is equal to or larger than a gate length of the peripheral logic transistor.

* * * * *